(12) United States Patent
Fan

(10) Patent No.: US 10,235,920 B2
(45) Date of Patent: Mar. 19, 2019

(54) GRAPHENE DISPLAY, DRIVING METHOD AND DRIVING DEVICE THEREFOR

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 274 days.

(21) Appl. No.: 15/123,753

(22) PCT Filed: Jun. 23, 2016

(86) PCT No.: PCT/CN2016/086813
§ 371 (c)(1),
(2) Date: Sep. 6, 2016

(87) PCT Pub. No.: WO2017/201789
PCT Pub. Date: Nov. 30, 2017

(65) Prior Publication Data
US 2018/0261139 A1  Sep. 13, 2018

(30) Foreign Application Priority Data
May 27, 2016 (CN) .......................... 2016 1 0367023

(51) Int. Cl.
*G09G 3/20* (2006.01)
*G09G 3/32* (2016.01)
(Continued)

(52) U.S. Cl.
CPC ............. *G09G 3/2003* (2013.01); *G09G 3/20* (2013.01); *H01L 27/156* (2013.01); *H01L 33/28* (2013.01);
(Continued)

(58) Field of Classification Search
CPC ... G09G 3/32; G09G 5/02; G09G 5/10; G09F 9/33; H01L 25/0753; H01L 27/156;
(Continued)

(56) References Cited

U.S. PATENT DOCUMENTS 8,542,244 B2    9/2013  Kempf et al.
2008/0225056 A1  9/2008  Belik et al.
(Continued)

FOREIGN PATENT DOCUMENTS

CN    102129852 A    7/2011
CN    102707510 A    10/2012
CN    104124348 A    10/2014

*Primary Examiner* — Sardis F Azongha
(74) *Attorney, Agent, or Firm* — Andrew C. Cheng

(57) ABSTRACT

A graphene display, and the graphene display's driving method and device are disclosed. The graphene display driving method includes: obtaining the grey-level values of the three primary colors of a pixel to be input; determining the colors and the grey-level values of the two dynamic subpixels and the static subpixel according to the grey-level values of the pixel's three primary colors and a pre-determined correspondence relationship between three primary colors' grey-level values and four primary colors' grey-level values; and applying driving voltages respectively corresponding to the colors and grey-level values of the two dynamic subpixels and the static subpixel to the two dynamic subpixels and the static subpixel. The present disclosure is able to achieve a greater gamut, enhance display quality, and reduce power consumption of the display.

9 Claims, 5 Drawing Sheets

(51) Int. Cl.
*H01L 27/15* (2006.01)
*H01L 33/28* (2010.01)

(52) U.S. Cl.
CPC ....... *G09G 3/32* (2013.01); *G09G 2300/0452* (2013.01); *G09G 2340/06* (2013.01); *G09G 2360/16* (2013.01)

(58) Field of Classification Search
CPC ..... H01L 33/0041; H01L 33/44; H01L 29/78; H05B 33/0857; H04N 9/87
See application file for complete search history.

(56) References Cited

U.S. PATENT DOCUMENTS

| | | |
|---|---|---|
| 2010/0103201 A1 | 4/2010 | Nakanishi et al. |
| 2012/0154708 A1 | 6/2012 | Feng et al. |
| 2013/0256629 A1* | 10/2013 | Lee ........................ H01L 27/283 257/13 |
| 2014/0253422 A1* | 9/2014 | Tomizawa ........ G02F 1/133514 345/88 |
| 2015/0146098 A1* | 5/2015 | Kanda ...................... G09G 5/02 348/453 |
| 2015/0226890 A1 | 8/2015 | Jin |
| 2017/0168365 A1 | 6/2017 | Yu et al. |
| 2017/0256679 A1 | 9/2017 | Fan |

\* cited by examiner

GRAPHENE DISPLAY, DRIVING METHOD AND DRIVING DEVICE THEREFOR

BACKGROUND OF THE INVENTION

1. Field of the Invention

The present disclosure generally relates to display techniques, and particularly relates to a graphene display, and driving method and device for the graphene display.

2. The Related Arts

As liquid crystal displays (LCDs) are widely popular, users seek even greater performance from LCDs. Conventional LCDs, even those RGB or RGBY displays of high color gamut (HCG), cannot satisfy users' demand for greater color gamut coverage.

In recent years, graphene is gradually applied to the field of display. Graphene has some excellent features such as high transparency (transmittance≈97.7%), high thermal conductivity (up to 5300 W/m·K), high electron mobility (over 1500 cm2/V·s), and therefore graphene's application to the displays is gaining more attention, especially for touch-sensitive displays (replacing the conventional transparent conductive film ITO) and LEDs. Theoretically, graphene's gamut may reach 158%. However, in practice, there is currently no solution for achieving such a high gamut coverage.

SUMMARY OF THE INVENTION

The technical issue addressed by the present disclosure is to provide a graphene display, and a driving method and a driving device to the graphene display capable of enhancing display's gamut and display quality, and reducing power consumption of the display.

The present disclosure teaches a graphene display including a display panel and a driving device electrically connected to the display panel. The display panel includes a number of pixels arranged in an array, and each pixel includes two dynamic subpixels and a static subpixel. The driving device includes an acquisition member obtaining grey-level values of three primary colors of a pixel to be input, a determination member determining colors and the grey-level values of the two dynamic subpixels and the static subpixel according to the grey-level values of the pixel's three primary colors and a pre-determined correspondence relationship between three primary colors' grey-level values and four primary colors' grey-level values, and a driving member applying driving voltages respectively corresponding to the colors and grey-level values of the two dynamic subpixels and the static subpixel to the two dynamic subpixels and the static subpixel.

The three primary colors are colors red, green, and blue; and the four primary colors are colors red, green, blue, and cyan.

The determination member further determines a gamut block in a gamut coordinate system where a target color of the pixel is located according to the grey-level values of the three primary colors, where the gamut coordinate system includes three gamut blocks respectively corresponding to the four primary colors, and the colors and grey-level values of the two dynamic subpixels and the static subpixel according to the gamut block where the target color is located.

The determination member further determines a maximum (a) and a minimum (b) of the grey-level values Ri, Gi, Bi of the to-be-input red, green, blue colors of the pixel as a=max(Ri, Gi, Bi) and b=min(Ri, Gi, Bi), the target color of the pixel falling within the gamut block WGRB in the gamut coordinate system if b≠Gi and a≠b, the target color of the pixel falling within the gamut block WGC in the gamut coordinate system if b=Ri or a=b, and a=Gi, and the target color of the pixel falling within the gamut block WCB in the gamut coordinate system if b=Ri or a=b, and a≠Gi.

The determination member further sets $R_{gi}=R_i$, $G_{gi}=G_i$, $B_{gi}=B_i$ if the target color of the pixel falls within the gamut block WGRB, $R_{gi}=R_i$, $$G_{gi} = 255 \times \left[\left(\frac{G_i}{255}\right)^\gamma - \left(\frac{B_i}{255}\right)^\gamma\right]^{\frac{1}{\gamma}},$$

$C_{gi}=B_i$ if the target color of the pixel falls within the gamut block WGC, and $R_{gi}=B_i$, $C_{gi}=G_i$, $$B_{gi} = 255 \times \left[\left(\frac{B_i}{255}\right)^\gamma - \left(\frac{G_i}{255}\right)^\gamma\right]^{\frac{1}{\gamma}}$$

if the target color of the pixel falls within the gamut block WCB, where $R_{gi}$, $G_{gi}$, $B_{gi}$, $C_{gi}$ are the grey-level values of the four primary colors red, green, blue, and cyan, and γ is a pre-determined gamma value.

The driving device further includes a gamut coordinate system construction member for establishing a gamut coordinate system of four primary colors, and partitioning the gamut coordinate system into three gamut blocks WGRB, WGC, and WCB.

The present disclosure also teaches a driving method of a graphene display where each pixel of the graphene display includes two dynamic subpixels and a static subpixel. The driving method includes obtaining grey-level values of three primary colors of a pixel to be input, determining colors and the grey-level values of the two dynamic subpixels and the static subpixel according to the grey-level values of the pixel's three primary colors and a pre-determined correspondence relationship between three primary colors' grey-level values and four primary colors' grey-level values, and applying driving voltages respectively corresponding to the colors and grey-level values of the two dynamic subpixels and the static subpixel to the two dynamic subpixels and the static subpixel.

The three primary colors are colors red, green, and blue; and the four primary colors are colors red, green, blue, and cyan.

The step of determining colors and the grey-level values of the two dynamic subpixels and the static subpixel according to the grey-level values of the pixel's three primary colors and a pre-determined correspondence relationship between three primary colors' grey-level values and four primary colors' grey-level values includes determining a gamut block in a gamut coordinate system where a target color of the pixel is located according to the grey-level values of the three primary colors, where the gamut coordinate system includes three gamut blocks respectively corresponding to the four primary colors, and determining the colors and grey-level values of the two dynamic subpixels and the static subpixel according to the gamut block where the target color is located.

The step of determining a gamut block in a gamut coordinate system where a target color of the pixel is located according to the grey-level values of the three primary colors includes: obtaining a maximum (a) and a minimum (b) of the grey-level values Ri, Gi, Bi of the to-be-input red, green, blue colors of the pixel as a=max(Ri, Gi, Bi) and b=min(Ri, Gi, Bi), determining that the target color of the pixel falls within the gamut block WGRB in the gamut coordinate system if b≠Gi and a≠b, determining that the target color of the pixel falls within the gamut block WGC in the gamut coordinate system if b=Ri or a=b, and a=Gi, and determining that the target color of the pixel falls within the gamut block WCB in the gamut coordinate system if b=Ri or a=b, and a≠Gi.

The step of determining the colors and grey-level values of the two dynamic subpixels and the static subpixel according to the gamut block where the target color is located includes: setting $R_{gi}=R_i$, $G_{gi}=G_i$, $B_{gi}=B_i$ if the target color of the pixel falls within the gamut block WGRB, $R_{gi}=R_i$, $$G_{gi} = 255 \times \left[ \left( \frac{G_i}{255} \right)^\gamma - \left( \frac{B_i}{255} \right)^\gamma \right]^{\frac{1}{\gamma}},$$

$C_{gi}=B_i$ if the target color of the pixel falls within the gamut block WGC, and $R_{gi}=B_i$, $C_{gi}=G_i$, $$B_{gi} = 255 \times \left[ \left( \frac{B_i}{255} \right)^\gamma - \left( \frac{G_i}{255} \right)^\gamma \right]^{\frac{1}{\gamma}}$$

if the target color of the pixel falls within the gamut block WCB, where $R_{gi}$, $G_{gi}$, $B_{gi}$, $C_{gi}$ are the grey-level values of the four primary colors red, green, blue, and cyan, and γ is a pre-determined gamma value.

The driving method further includes: establishing a gamut coordinate system of four primary colors, and partitioning the gamut coordinate system into three gamut blocks WGRB, WGC, and WCB.

The present disclosure also teaches a driving device of a graphene display where each pixel of the graphene display includes two dynamic subpixels and a static subpixel. The driving device includes an acquisition member for obtaining grey-level values of three primary colors of a pixel to be input, a determination member for determining colors and the grey-level values of the two dynamic subpixels and the static subpixel according to the grey-level values of the pixel's three primary colors and a pre-determined correspondence relationship between three primary colors' grey-level values and four primary colors' grey-level values, and a driving member for applying driving voltages respectively corresponding to the colors and grey-level values of the two dynamic subpixels and the static subpixel to the two dynamic subpixels and the static subpixel.

The three primary colors are colors red, green, and blue; and the four primary colors are colors red, green, blue, and cyan.

The determination member further determines a gamut block in a gamut coordinate system where a target color of the pixel is located according to the grey-level values of the three primary colors, where the gamut coordinate system includes three gamut blocks respectively corresponding to the four primary colors, and the colors and grey-level values of the two dynamic subpixels and the static subpixel according to the gamut block where the target color is located.

The determination member further determines a maximum (a) and a minimum (b) of the grey-level values Ri, Gi, Bi of the to-be-input red, green, blue colors of the pixel as a=max(Ri, Gi, Bi) and b=min(Ri, Gi, Bi), the target color of the pixel falling within the gamut block WGRB in the gamut coordinate system if b≠Gi and a≠b, the target color of the pixel falling within the gamut block WGC in the gamut coordinate system if b=Ri or a=b, and a=Gi, and the target color of the pixel falling within the gamut block WCB in the gamut coordinate system if b=Ri or a=b, and a≠Gi.

The determination member further sets $R_{gi}=R_i$, $G_{gi}=G_i$, $B_{gi}=B_i$ if the target color of the pixel falls within the gamut block WGRB, $R_{gi}=R_i$, $$G_{gi} = 255 \times \left[ \left( \frac{G_i}{255} \right)^\gamma - \left( \frac{B_i}{255} \right)^\gamma \right]^{\frac{1}{\gamma}},$$

$C_{gi}=B_i$ if the target color of the pixel falls within the gamut block WGC, and $R_{gi}=B_i$, $C_{gi}=G_i$, $$B_{gi} = 255 \times \left[ \left( \frac{B_i}{255} \right)^\gamma - \left( \frac{G_i}{255} \right)^\gamma \right]^{\frac{1}{\gamma}}$$

if the target color of the pixel falls within the gamut block WCB, where $R_{gi}$, $G_{gi}$, $B_{gi}$, $C_{gi}$ are the grey-level values of the four primary colors red, green, blue, and cyan, and γ is a pre-determined gamma value.

The driving device further includes a gamut coordinate system construction member for establishing a gamut coordinate system of four primary colors, and partitioning the gamut coordinate system into three gamut blocks WGRB, WGC, and WCB.

The driving device further includes a gamut coordinate system construction member for establishing a gamut coordinate system of four primary colors, and partitioning the gamut coordinate system into three gamut blocks WGRB, WGC, and WCB.

In contrast to prior art, the graphene display driving method of the present disclosure includes: obtaining the grey-level values of the three primary colors of a pixel to be input; determining the colors and the grey-level values of the two dynamic subpixels and the static subpixel according to the grey-level values of the pixel's three primary colors and a pre-determined correspondence relationship between three primary colors' grey-level values and four primary colors' grey-level values; and applying driving voltages respectively corresponding to the colors and grey-level values of the two dynamic subpixels and the static subpixel to the two dynamic subpixels and the static subpixel. Through the above teaching, a graphene display of greater than 142% gamut may be achieved, significantly greater than that of any display. In addition, the gamut may completely cover that of real surface colors seen by the human eye. Therefore high color fidelity is achieved, and display quality is significantly enhanced. Furthermore, the enhanced gamut leads to higher aperture ratio, and reduced power consumption of the display.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

Figure 1:
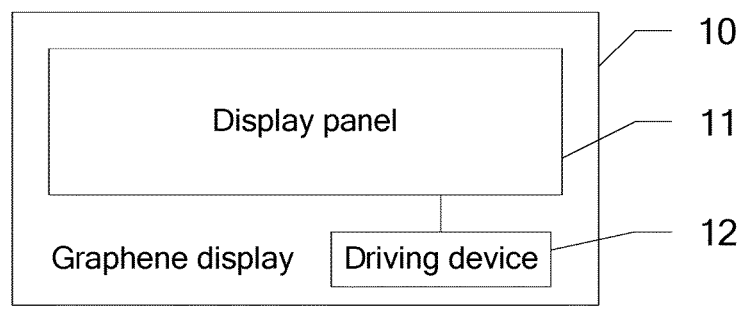
FIG. 1 is a schematic diagram showing a graphene display according to an embodiment of the present disclosure.

FIG. 1 is a schematic diagram showing a graphene display according to an embodiment of the present disclosure. As illustrated, the graphene display 10 includes a display panel 11 and a driving device 12 electrically connected to the display panel 11.

Figure 2:
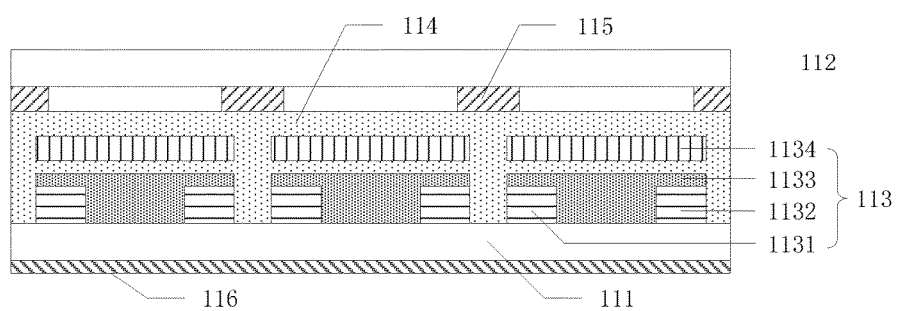
FIG. 2 is a schematic showing the epitaxial structure of a display panel of the graphene display of FIG. 1.

As shown in FIG. 2, the display panel 11 includes a lower substrate 111, an upper substrate 112, and lighting elements 113 disposed between the lower and upper substrates 111 and 112 and arranged in an array. The lighting elements 113 illuminates under the control of the driving device 12 so that the graphene display 10 is able to perform display.

Each lighting element 113 includes a source 1131 and a drain 1132 on the lower substrate 111 separated with a gap. The source 1131, the drain 1132, and the gap are covered with a light generating layer 1133. A gate 1134 is disposed above the light generating layer 1133.

Specifically, the source 1131 and the drain 1132 is made of reduced graphene oxide, the light generating layer 1133 is made of semi-reduced graphene oxide, and the gate 1134 is made of graphene oxide. The lower substrate is made of at least one of an airtight and watertight transparent organic material such as polyethylene terephthalate (PET), glass, and nickel. The upper substrate 112 is made of at least one of PET and glass.

Alternatively, the display panel 11 further includes a protection layer 114 covering the light generating elements 113, and a black matrix layer 114 on the protection layer 114.

Alternatively, the display panel 11 further includes a reflection layer 116 beneath the lower substrate 111 opposite to the side where the light generating elements 113 are disposed. The reflection layer 116 is made of a metal of high reflectivity.

It should be understood that a light generating element 113 functions as a subpixel, and three light generating elements 113 (i.e., three subpixels) constitute a pixel. The three subpixels includes two dynamic subpixels and a static one.

The static subpixel always provides a fixed R, G, or B color whereas the dynamic pixels provides any one of the RGBC colors.

For a dynamic pixel, it provides light of different colors depending on the applied gate voltage. For example, when the gate voltage is 0-10V and the source-drain voltage (Vds) is greater than the threshold voltage (Vth), the dynamic subpixel provides red light; when the gate voltage is 20-30V and Vds is greater than Vth, the dynamic subpixel provides green light, and when the gate voltage is 40-50V and Vds is greater than Vth, the dynamic subpixel provides blue light. Therefore, by varying the gate voltage, the color of the graphene display may be changed (i.e., grey level may be adjusted).

The structure and driving method of the driving device 12 are provided as follows.

Figure 3:
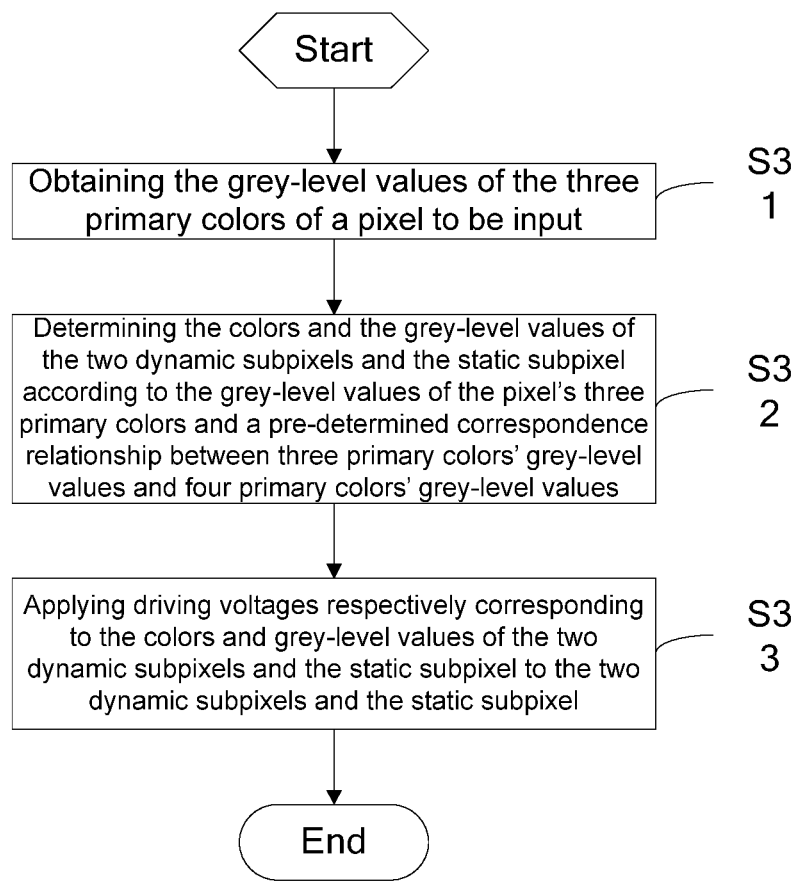
FIG. 3 is a flow diagram showing the steps of a graphene display driving method according to an embodiment of the present disclosure.

FIG. 3 is a flow diagram showing the steps of a graphene display driving method according to an embodiment of the present disclosure. The driving method includes the following steps.

In step S31, the grey-level values of the three primary colors of a pixel to be input are obtained.

The three primary colors may be red, green, and blue (i.e., usually referred to as RGB). In alternative embodiments, they may be different colors such as red, green, and yellow.

Specifically, the grey-level values of the three primary colors may be extracted from the received image signal, or obtained through means such as scan, capture, etc. Each grey-level value is usually between 0 and 255 (i.e., total 256 different values). For example, if the three primary colors are RGB, the grey-level values may be 122 for color R, 156 for color G, and 255 for color B. In alternative embodiments, the grey-level values may be replaced by grey-scale values (i.e., the ratios of the grey-level values to the highest grey-level value 255).

In step S32, the colors and the grey-level values of the two dynamic subpixels and the static subpixel are determined according to the grey-level values of the pixel's three primary colors and a pre-determined correspondence relationship between three primary colors' grey-level values and four primary colors' grey-level values.

In one embodiment, the four primary colors are red, green, blue, and cyan,

Specifically, since a pixel includes two dynamic subpixels and a static subpixel, the pixel is able to show one of three colors or a combination of three colors. Therefore, except the static subpixel, two colors have to be chosen from the four primary colors for presentation through the two dynamic subpixels. The choice may be made according to the pre-determined correspondence relationship between three primary colors' grey-level values and four primary colors' grey-level values.

For example, if the grey-level values of the three primary colors satisfy a pre-determined first condition, the two dynamic subpixel and the static subpixel show red, green, and blue colors, respectively. If the grey-level values of the three primary colors satisfy a pre-determined second condition, the two dynamic subpixel and the static subpixel show red, green, and yellow colors, respectively. The grey-level value of the color yellow may be calculated using the grey-level values of the three primary colors red, green, and blue. As such, gamut is greatly enhanced through three primary colors' grey-level values and using four primary colors.

A specific embodiment of the step S32 is described as follows.

In the embodiment, the step S32 includes the following steps.

In step S321, a gamut block in the gamut coordinate system where a target color of the pixel is located is determined according to the grey-level values of the three primary colors. The gamut coordinate system includes three gamut blocks respectively corresponding to the four primary colors.

Figure 4:
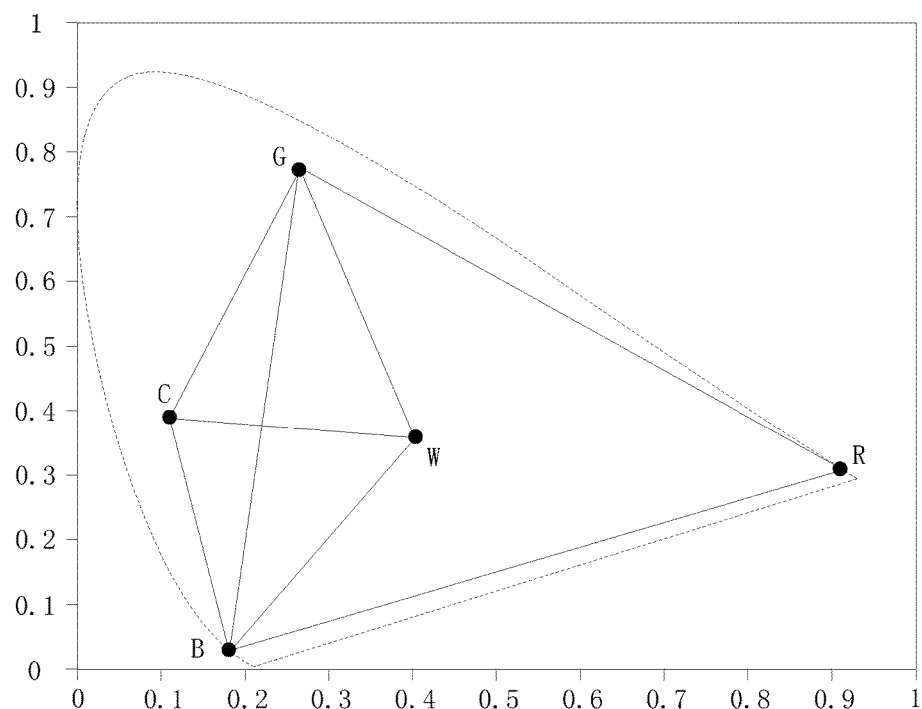
FIG. 4 provides a gamut coordinate system of a graphene display driving method according to an embodiment of the present disclosure.

As shown in FIG. 4, the gamut coordinate system includes three gamut blocks: WGRB, WGC, and WCB. In order to achieve more smooth color transition in the gamut blocks and the entire gamut, the present embodiment optionally adopts a uniform color coordinate system such as CIE1976. However the present disclosure is not limited as such. The dotted line in FIG. 4 indicates the Pointer's gamut (i.e., the gamut of real surface colors as can be seen by the human eye).

Specifically, the coordinates of the target color in the gamut coordinate system may be calculated through the grey-level values of the three primary colors using existing techniques and the details are omitted here.

A method in determining the gamut block where the pixel's target color is located in the gamut coordinate system through input RGB values is described as follows.

A maximum (a) and a minimum (b) of the grey-level values $R_i$, $G_i$, $B_i$ of the to-be-input red, green, blue colors of the pixel are obtained as a=max($R_i$, $G_i$, $B_i$) and b=min($R_i$, $G_i$, $B_i$).

If b≠$G_i$ and a≠b, the target color of the pixel falls within the gamut block WGRB in the gamut coordinate system. If b=$R_i$ or a=b, and a=$G_i$, the target color of the pixel falls within the gamut block WGC in the gamut coordinate system. If b=$R_i$ or a=b, and a≠$G_i$, the target color of the pixel falls within the gamut block WCB in the gamut coordinate system.

In step S322, according to the gamut block where the target color is located, the colors and grey-level values of the subpixels are determined.

Let $R_{gi}$, $G_{gi}$, $B_{gi}$, $C_{gi}$ be the grey-level values of the four primary colors red, green, blue, and cyan, and γ be a pre-determined gamma value. In one embodiment, $R_{gi}=R_i$, $G_{gi}=G_i$, $B_{gi}=B_i$ if the target color of the pixel falls within the gamut block WGRB, $R_{gi}=R_i$, $$G_{gi} = 255 \times \left[\left(\frac{G_i}{255}\right)^\gamma - \left(\frac{B_i}{255}\right)^\gamma\right]^{\frac{1}{\gamma}},$$

$C_{gi}=B_i$ if the target color of the pixel falls within the gamut block WGC, and $R_{gi}=B_i$, $C_{gi}=G_i$, $$B_{gi} = 255 \times \left[\left(\frac{B_i}{255}\right)^\gamma - \left(\frac{G_i}{255}\right)^\gamma\right]^{\frac{1}{\gamma}}$$

if the target color of the pixel falls within the gamut block WCB.

Figure 5:
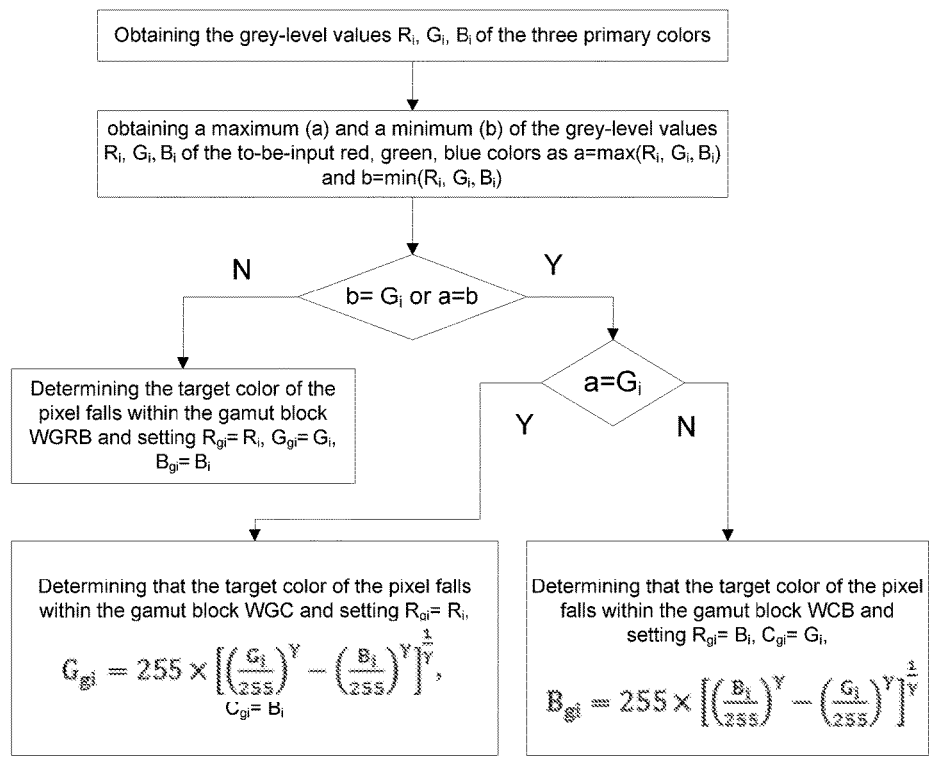
FIG. 5 is a flow diagram showing the details of the step S32 of FIG. 3 according to an embodiment of the present disclosure.

In one embodiment, S32 may include the steps outlined in the flow diagram of FIG. 5. Its principle is described as above and the details are omitted.

In step S33, driving voltages respectively corresponding to the colors and grey-level values of the two dynamic subpixels and the static subpixel are applied to the two dynamic subpixels and the static subpixel.

The following is an example describing the details of the present embodiment.

Let the input grey-level values of the red, green, blue colors be $R_i$=89, $G_i$=188, $B_i$=117, and therefore the maximum (a) and the minimum (b) are a=188, b=89.

As described above, as b=$R_i$ and a=$G_i$, the target color of the pixel falls within the gamut block WGC in the gamut coordinate system. Let γ be 2.2. Then, $R_{gi}=R_i$=89, $$G_{gi} = 255 \times \left[\left(\frac{G_i}{255}\right)^\gamma - \left(\frac{B_i}{255}\right)^\gamma\right]^{\frac{1}{\gamma}} = 153 \text{ (approximated value)},$$

$$C_{gi} = B_i = 117.$$

In other words, the three subpixels are of colors red, green, and cyan, and color red's grey-level value is 89, color green's grey-level value is 153, and color cyan's grey-level value is 117.

In contrast to the prior art, the graphene display driving method of the present embodiment includes: obtaining the grey-level values of the three primary colors of a pixel to be input; determining the colors and the grey-level values of the two dynamic subpixels and the static subpixel according to the grey-level values of the pixel's three primary colors and a pre-determined correspondence relationship between three primary colors' grey-level values and four primary colors' grey-level values; and applying driving voltages respectively corresponding to the colors and grey-level values of the two dynamic subpixels and the static subpixel to the two dynamic subpixels and the static subpixel. Through the above embodiment, a graphene display of greater than 142% gamut may be achieved, significantly greater than that of any display. In addition, the gamut may completely cover that of real surface colors seen by the human eye. Therefore high color fidelity is achieved, and display quality is significantly enhanced. Furthermore, the enhanced gamut leads to higher aperture ratio, and reduced power consumption of the display.

Figure 6:
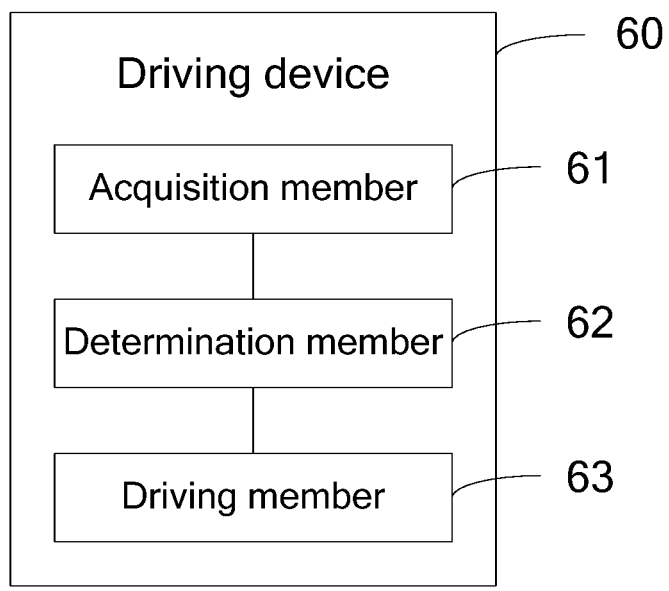
FIG. 6 is a schematic functional block diagram showing a driving device to a graphene display according to an embodiment of the present disclosure.

FIG. 6 is a schematic functional block diagram showing a driving device to a graphene display according to an embodiment of the present disclosure. As illustrated, the driving device 60 includes the following components.

An acquisition member 61 is for obtaining the grey-level values of the three primary colors of a pixel to be input.

A determination member 62 is for determining the colors and the grey-level values of the two dynamic subpixels and the static subpixel according to the grey-level values of the pixel's three primary colors and a pre-determined correspondence relationship between three primary colors' grey-level values and four primary colors' grey-level values.

A driving member 63 is for applying driving voltages respectively corresponding to the colors and grey-level values of the two dynamic subpixels and the static subpixel to the two dynamic subpixels and the static subpixel.

The three primary colors are colors red, green, and blue, and the four primary colors are colors red, green, blue, and cyan.

In one embodiment, the determination member 62 further determines a gamut block in the gamut coordinate system where a target color of the pixel is located according to the grey-level values of the three primary colors. The gamut coordinate system includes three gamut blocks respectively corresponding to the four primary colors. The determination member 62 then further determines the colors and grey-level values of the two dynamic subpixels and the static subpixel according to the gamut block where the target color is located.

In one embodiment, a maximum (a) and a minimum (b) of the grey-level values $R_i$, $G_i$, $B_i$ of the to-be-input red, green, blue colors of the pixel are obtained as a=max($R_i$, $G_i$, $B_i$) and b=min($R_i$, $G_i$, $B_i$). If b≠$G_i$ and a≠b, the target color of the pixel is determined to fall within the gamut block WGRB in the gamut coordinate system. If b=$R_i$ or a=b, and a=$G_i$, the target color of the pixel is determined to fall within the gamut block WGC in the gamut coordinate system. If b=$R_i$ or a=b, and a≠$G_i$, the target color of the pixel is determined to fall within the gamut block WCB in the gamut coordinate system.

In one embodiment, the determination member 62 conducts the following: $R_{gi}=R_i$, $G_{gi}=G_i$, $B_{gi}=B_i$ if the target color of the pixel falls within the gamut block WGRB, $R_{gi}=R_i$, $$G_{gi} = 255 \times \left[\left(\frac{G_i}{255}\right)^\gamma - \left(\frac{B_i}{255}\right)^\gamma\right]^{\frac{1}{\gamma}},$$

$C_{gi}=B_i$ if the target color of the pixel falls within the gamut block WGC, and $R_{gi}=B_i$, $C_{gi}=G_i$, $$B_{gi} = 255 \times \left[\left(\frac{B_i}{255}\right)^\gamma - \left(\frac{G_i}{255}\right)^\gamma\right]^{\frac{1}{\gamma}}$$

if the target color of the pixel falls within the gamut block WCB, where $R_{gi}$, $G_{gi}$, $B_{gi}$, $C_{gi}$ are the grey-level values of the four primary colors red, green, blue, and cyan, and γ is a pre-determined gamma value.

The driving device further includes a gamut coordinate system construction member for establishing a gamut coordinate system of four primary colors, and partitioning the gamut coordinate system into three gamut blocks WGRB, WGC, and WCB.

It should be understood that the above driving device is an embodiment of the above-described driving method. Its operation principle and steps are similar and details are omitted.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the claims of the present disclosure.

What is claimed is:

1. A graphene display, comprising a display panel and a driving device electrically connected to the display panel, wherein the display panel comprises a plurality of pixels arranged in an array; each pixel comprises two dynamic subpixels and a static subpixel; and the driving device comprises:
   an acquisition member obtaining grey-level values of three primary colors of a pixel to be input,
   a determination member determining colors and the grey-level values of the two dynamic subpixels and the static subpixel according to the grey-level values of the pixel's three primary colors and a pre-determined correspondence relationship between three primary colors' grey-level values and four primary colors' grey-level values, and
   a driving member applying driving voltages respectively corresponding to the colors and grey-level values of the two dynamic subpixels and the static subpixel to the two dynamic subpixels and the static subpixel;

wherein the three primary colors are colors red, green, and blue; and the four primary colors are colors red, green, blue, and cyan;
wherein the determination member further determines:
   a gamut block in a gamut coordinate system where a target color of the pixel is located according to the grey-level values of the three primary colors, where the gamut coordinate system comprises three gamut blocks respectively corresponding to the four primary colors, and
   the colors and grey-level values of the two dynamic subpixels and the static subpixel according to the gamut block where the target color is located;
   a maximum (a) and a minimum (b) of the grey-level values $R_i$, $G_i$, $B_i$ of the to-be-input red, green, blue colors of the pixel as a=max($R_i$, $G_i$, $B_i$) and b=min ($R_i$, $G_i$, $B_i$),
   the target color of the pixel falling within the gamut block WGRB in the gamut coordinate system if b≠$G_i$ and a≠b,
   the target color of the pixel falling within the gamut block WGC in the gamut coordinate system if b=$R_i$ or a=b, and a=$G_i$, and
   the target color of the pixel falling within the gamut block WCB in the gamut coordinate system if b=$R_i$ or a=b, and a≠$G_i$.

2. The graphene display as claimed in claim 1, wherein the determination member further sets:
   Rgi=Ri, Ggi=Gi, Bgi=Bi if the target color of the pixel falls within the gamut block WGRB,
   $R_{gi}=R_i$, $$G_{gi} = 255 \times \left[\left(\frac{G_i}{255}\right)^\gamma - \left(\frac{B_i}{255}\right)^\gamma\right]^{\frac{1}{\gamma}},$$

$C_{gi}=B_i$ if the target color of the pixel falls within the gamut block WGC, and
   $R_{gi}B_i$, $C_{gi}=G_i$, $$B_{gi} = 255 \times \left[\left(\frac{B_i}{255}\right)^\gamma - \left(\frac{G_i}{255}\right)^\gamma\right]^{\frac{1}{\gamma}},$$

if the target color of the pixel falls within the gamut block WCB,
   where $R_{gi}$, $G_{gi}$, $B_{gi}$, $C_{gi}$ are the grey-level values of the four primary colors red, green, blue, and cyan, and γ is a pre-determined gamma value.

3. The graphene display as claimed in claim 1, wherein the driving device further comprises a gamut coordinate system construction member for establishing a gamut coordinate system of four primary colors, and partitioning the gamut coordinate system into three gamut blocks WGRB, WGC, and WCB.

4. A driving method of a graphene display where each pixel of the graphene display comprises two dynamic subpixels and a static subpixel, the driving method comprising:
   obtaining grey-level values of three primary colors of a pixel to be input;
   determining colors and the grey-level values of the two dynamic subpixels and the static subpixel according to the grey-level values of the pixel's three primary colors and a pre-determined correspondence relationship between three primary colors' grey-level values and four primary colors' grey-level values; and applying driving voltages respectively corresponding to the colors and grey-level values of the two dynamic subpixels and the static subpixel to the two dynamic subpixels and the static subpixel;

wherein the three primary colors are colors red, green, and blue; and the four primary colors are colors red, green, blue, and cyan;

wherein the step of determining colors and the grey-level values of the two dynamic subpixels and the static subpixel according to the grey-level values of the pixel's three primary colors and a pre-determined correspondence relationship between three primary colors' grey-level values and four primary colors' grey-level values comprises:

determining a gamut block in a gamut coordinate system where a target color of the pixel is located according to the grey-level values of the three primary colors, where the gamut coordinate system comprises three gamut blocks respectively corresponding to the four primary colors; and determining the colors and grey-level values of the two dynamic subpixels and the static subpixel according to the gamut block where the target color is located;

wherein the step of determining a gamut block in a gamut coordinate system where a target color of the pixel is located according to the grey-level values of the three primary colors comprises:

obtaining a maximum (a) and a minimum (b) of the grey-level values $R_i$, $G_i$, $B_i$ of the to-be-input red, green, blue colors of the pixel as $a=\max(R_i, G_i, B_i)$ and $b=\min(R_i, G_i, B_i)$;

determining that the target color of the pixel falls within the gamut block WGRB in the gamut coordinate system if $b \neq G_i$ and $a \neq b$;

determining that the target color of the pixel falls within the gamut block WGC in the gamut coordinate system if $b=R_i$ or $a=b$, and $a=G_i$; and determining that the target color of the pixel falls within the gamut block WCB in the gamut coordinate system if $b=R_i$ or $a=b$, and $a \neq G_i$.

5. The driving method as claimed in claim 4, wherein the step of determining the colors and grey-level values of the two dynamic subpixels and the static subpixel according to the gamut block where the target color is located comprises:

setting $R_{gi}=R_i$, $G_{gi}=G_i$, $B_{gi}=B_i$ if the target color of the pixel falls within the gamut block WGRB;

setting $R_{gi}=R_i$, $$G_{gi} = 255 \times \left[\left(\frac{G_i}{255}\right)^\gamma - \left(\frac{B_i}{255}\right)^\gamma\right]^{\frac{1}{\gamma}},$$

$C_{gi}=B_i$ if the target color of the pixel falls within the gamut block WGC; and setting $R_{gi}=B_i$, $C_{gi}=G_i$, $$B_{gi} = 255 \times \left[\left(\frac{B_i}{255}\right)^\gamma - \left(\frac{G_i}{255}\right)^\gamma\right]^{\frac{1}{\gamma}},$$

if the target color of the pixel falls within the gamut block WCB;

where $R_{gi}$, $G_{gi}$, $B_{gi}$, $C_{gi}$ are the grey-level values of the four primary colors red, green, blue, and cyan, and $\gamma$ is a pre-determined gamma value.

6. The driving method as claimed in claim 4, further comprising:

establishing a gamut coordinate system of four primary colors; and partitioning the gamut coordinate system into three gamut blocks WGRB, WGC, and WCB.

7. A driving device of a graphene display where each pixel of the graphene display comprises two dynamic subpixels and a static subpixel, the driving device comprising:

an acquisition member obtaining grey-level values of three primary colors of a pixel to be input, a determination member determining colors and the grey-level values of the two dynamic subpixels and the static subpixel according to the grey-level values of the pixel's three primary colors and a pre-determined correspondence relationship between three primary colors' grey-level values and four primary colors' grey-level values, and a driving member applying driving voltages respectively corresponding to the colors and grey-level values of the two dynamic subpixels and the static subpixel to the two dynamic subpixels and the static subpixel;

wherein the three primary colors are colors red, green, and blue; and the four primary colors are colors red, green, blue, and cyan;

wherein the determination member further determines:

a gamut block in a gamut coordinate system where a target color of the pixel is located according to the grey-level values of the three primary colors, where the gamut coordinate system includes three gamut blocks respectively corresponding to the four primary colors, and the colors and grey-level values of the two dynamic subpixels and the static subpixel according to the gamut block where the target color is located;

a maximum (a) and a minimum (b) of the grey-level values $R_i$, $G_i$, Bi of the to-be-input red, green, blue colors of the pixel as $a=\max(R_i, G_i, B_i)$ and $b=\min(R_i, G_i, B_i)$, the target color of the pixel falling within the gamut block WGRB in the gamut coordinate system if $b \neq G_i$ and $a \neq b$, the target color of the pixel falling within the gamut block WGC in the gamut coordinate system if $b=R_i$ or $a=b$, and $a=G_i$, and the target color of the pixel falling within the gamut block WCB in the gamut coordinate system if $b=R_i$ or $a=b$, and $a \neq G_i$;

a maximum (a) and a minimum (b) of the grey-level values $R_i$, $G_i$, Bi of the to-be-input red, green, blue colors of the pixel as $a=\max(R_i, G_i, B_i)$ and $b=\min(R_i, G_i, B_i)$, the target color of the pixel falling within the gamut block WGRB in the gamut coordinate system if $b \neq G_i$ and $a \neq b$, the target color of the pixel falling within the gamut block WGC in the gamut coordinate system if $b=R_i$ or $a=b$, and $a=G_i$, and the target color of the pixel falling within the gamut block WCB in the gamut coordinate system if $b=R_i$ or $a=b$, and $a \neq G_i$.

8. The driving device as claimed in claim 7, wherein the determination member further conducts:

$R_{gi}=R_i$, $G_{gi}=G_i$, $B_{gi}=B_i$ if the target color of the pixel falls within the gamut block WGRB, $R_{gi}=R_i$ $$G_{gi} = 255 \times \left[\left(\frac{G_i}{255}\right)^\gamma - \left(\frac{B_i}{255}\right)^\gamma\right]^{\frac{1}{\gamma}},$$

$G_{gi}=B_i$ if the target color of the pixel falls within the gamut block WGC, and $R_{gi}=B_i$, $C_{gi}=G_i$, $$B_{gi} = 255 \times \left[\left(\frac{B_i}{255}\right)^\gamma - \left(\frac{G_i}{255}\right)^\gamma\right]^{\frac{1}{\gamma}},$$

if the target color of the pixel falls within the gamut block WCB, where $R_{gi}$, $G_{gi}$, $B_{gi}$, $C_{gi}$ are the grey-level values of the four primary colors red, green, blue, and cyan, and $\gamma$ is a pre-determined gamma value.

9. The driving device as claimed in claim 7, further comprising a gamut coordinate system construction member for establishing a gamut coordinate system of four primary colors, and partitioning the gamut coordinate system into three gamut blocks WGRB, WGC, and WCB.

\* \* \* \* \*